United States Patent [19]
Davies

[11] Patent Number: 5,175,499
[45] Date of Patent: Dec. 29, 1992

[54] SYSTEMS AND MARKERS USING MAGNETIC OR SPIN RESONANCE PHENOMENA

[76] Inventor: Dafydd G. Davies, 19 Beche Road, Cambridge, CB5 8HX, England

[21] Appl. No.: 421,191

[22] Filed: Oct. 13, 1989

Related U.S. Application Data

[63] Continuation of PCT/GB8900136, Aug. 15, 1989, abandoned.

[30] Foreign Application Priority Data

Feb. 15, 1988 [GB] United Kingdom ............... 8803415
Aug. 12, 1988 [GB] United Kingdom ............... 8819176
Aug. 12, 1988 [GB] United Kingdom ............... 8819179

[51] Int. Cl.$^5$ ................................. G01R 33/20
[52] U.S. Cl. ................................ 324/300; 324/308
[58] Field of Search ............ 340/128, 572; 235/493; 324/300, 308, 307, 318, 322

[56] References Cited

U.S. PATENT DOCUMENTS

| | | |
|---|---|---|
| 4,510,490 | 4/1985 | Anderson, III et al. . |
| 4,514,691 | 4/1985 | De Los Santos et al. . |
| 4,581,524 | 4/1986 | Hoekmanet et al. ............ 235/493 |
| 4,593,284 | 6/1986 | Clifford et al. ............... 340/128 |
| 4,604,578 | 8/1986 | Young . |
| 4,644,276 | 2/1987 | Sierocuk et al. ............... 324/307 |
| 4,647,917 | 3/1987 | Anderson, III ............... 340/572 |

FOREIGN PATENT DOCUMENTS

228692 12/1986 European Pat. Off. .
2182451 11/1985 United Kingdom .

Primary Examiner—Michael J. Tokar
Attorney, Agent, or Firm—Sixbey, Friedman, Leedom & Ferguson

[57] ABSTRACT

Both an antipilferage marker and a system therefor is provided that uses magnetic spin resonance phenomena to generate unique and identifiable signals. The marker generally comprises a substrate which supports a material that generates and identifiable signal as a result of either nuclear magnetic resonance, nuclear quadrupole, electron spin resonance, electron paramagnetic resonance, ferromagnetic resonance, ferrimagnetic resonance, antiferrimagnetic resonance, domain wall resonance or spin wave resonance or spin-echoes. A magnetic material is further provided on the substrate for applying a magnetic field to the resonant material. In the system of the invention, a microwave or radio frequency source emits electromagnetic radiation which is absorbed by the resonant material which in turn reemits electromagnetic radiation having a specific and readily detectable frequency signature.

38 Claims, 4 Drawing Sheets

SYSTEMS AND MARKERS USING MAGNETIC OR SPIN RESONANCE PHENOMENA

This is a continuation of PCT application GB8900136 filed Aug. 15, 1989 and now abandoned, which is turn is based upon GB8803415 filed Feb. 15, 1988; GB8819176.2 filed Aug. 12, 1988; and GB8819179.6 filed Aug. 12, 1988.

This invention relates to systems and markers using magnetic or spin resonance phenomena for practical purposes. More particularly, but not exclusively, it is concerned with the use of magnetic resonance, spin resonance and spin-echo phenomena in systems for the surveillance, recognition, detection, sorting or monitoring of articles, stock or personnel. The applications of such systems include electronic article surveillance (theft prevention) and personnel verification.

The magnetic resonance phenomena are associated with nuclear, electron, atomic or molecular magnetic dipole moments acting individually or cooperatively in the presence of magnetic fields to give nuclear magnetic resonance (NMR), nuclear quadrupole resonance (NQR), electron spin resonance or electron paramagnetic resonance (ESR, EPR), ferromagnetic resonance, ferrimagnetic resonance, antiferrimagnetic resonance, domain wall resonance, spin-wave resonance or spin-echoes. For convenience, the term 'magnetic resonance' will be used herein to include all of these magnetic and spin phenomena. The magnetic resonance is exhibited when the dipole moments precessing in the magnetic fields absorb and re-radiate microwave or radio frequency electromagnetic radiation at or very close to the precession frequency.

A variety of electronic article surveillance or personnel detection systems currently exist. They involve detection of macroscopic magnetic properties or macroscopic resonances, associated with LC electrical circuit resonances, or bulk mechanical vibrational resonances, or with non-linear electrical transponders or high-permeability magnetically saturating soft magnetic elements.

Materials exhibiting the atomic resonance phenomena described above can be used in accordance with this invention for article recognition and/or detection and for security surveillance. Such use is possible because they can have extremely sharply defined resonant frequencies, which may be used to indicate their presence or identity. This can be achieved in a preferred embodiment of the invention by the use of a microwave or radio frequency emitting interrogation system which also detects an increase in the absorbtion of the interrogating electromagnetic energy or re-emission of electromagnetic energy by the marker at the resonant frequency.

According to one aspect of this invention, there is provided a detectable marker which comprises a substrate which supports (internally or externally) a material which is capable of supporting a magnetic resonance. Generally, such a marker will be provided with means whereby the marker can be attached to an article or body (e.g. a person) the location of which is to be monitored, recognised or detected or which is to be sorted or selected from a plurality of articles or bodies.

According to a second aspect of the present invention, there is provided a detectable marker which comprises a substrate including or supporting a plurality of magnetically active regions, at least one of which regions comprises a material capable of supporting a magnetic resonance.

The preferred magnetic resonance phenomena for the purposes of the present invention are ESR and spin echoes. The invention will be described hereinafter with particular reference to these phenomena, although it is to be understood that the invention is not restricted to systems or articles which make use only of these phenomena. The modifications necessary to practise the invention using other magnetic resonance phenomena, e.g. NMR or ferrimagnetic resonance, will be apparent to those skilled in the art.

The magnetic field required to produce defined resonances can be supplied either as a large field over the entire interrogation volume, or by a small permanent or semi-permanent magnet placed close to the resonant material and carried round with it and the article. Thus in one embodiment a permanent or semi-permanent magnet and the resonant material are fabricated as a unit which constitutes the detectable marker. In this embodiment it may still be advantageous to impose a small externally-generated magnetic field. This can be a d.c. field to counteract, for example, the Earth's field. Alternatively a small a.c. field operating at a low frequency, typically of a few kHz, can be used to scan repeatedly across resonance at this identifiable second frequency.

Markers in accordance with the present invention are distinct and identifiable (and different markers may be fabricated so as to have a unique magnetic resonance signature) since the combination of the resonating material and an established magnetic field is sufficiently unique to give a resonance which will not occur with everyday objects (or with other markers in accordance with this invention).

The magnetically resonant material is preferably electrically non-conductive.

The resonant material may be a solid, or a solid solution, or a solid/liquid solution, or a liquid/liquid solution.

According to third aspect of the present invention, there is provided a detection system for use with a tag or marker as defined above, which system comprises a gate which, in use, will be located at a point of sale location or between a point of sale location and an exit from the premises containing said point of sale location, which gate comprises means for emitting radiation in the microwave waveband; and means for detecting radiation emitted by the tag or marker in response to a magnetic field in conjunction with said microwave radiation. The magnetic field may be the earth's field or, if desired, it may be an enhanced field generated within the area defined by the gate; alternatively, the field may be generated by a component of the marker itself. The microwave radiation is preferably pulsed so that absorption by the tag or marker is time-differentiated from emission of radiation from the active atoms within the tag or marker due to decay of the excited ESR or NMR state. Detection of emitted radiation thus indicates presence of a tag or marker which has not been removed by an assistant at the point of sale.

Examples of materials which can be used for ESR detection include paramagnetic salts—i.e. salts containing paramagnetic ions, for example $Cu^{2+}$, $Mn^{2+}$, $Fe^{3+}$, $Gd^{3+}$, $Cr^{3+}$, $Tb^{3+}$, $Er^{3+}$—in particular transition group metal ions of the iron group, the palladium group, the platinum group, and the actinide group. In addition, certain organic molecules or stable free radicals have an unpaired electron and are paramagnetic— examples are naphthalene, nitroxides, diphenyl picryl hydrazyl, and triphenyl methyl. Crystalline solids containing ionic impurities are also suitable, as well as certain naturally occuring minerals exemplified by ultramarine.

The active paramagnetic moieties in the magnetically resonant material are preferably spaced apart from one another on the atomic scale in order to minimises coupling between neighbouring paramagnetic ions and hence gives a more sharply defined resonance. Thus salts containing paramagnetic metal ions are advantageously used in dilute form, for example dispersed to 1% dilution (by weight) in a diamagnetic salt or medium, for example in magnesium oxide.

Compounds containing nuclei with a net nuclear spin, such as hydrogen, carbon, nitrogen, chlorine, phosphorus, magnesium and calcium, can all be used for NMR detection. Isotopes with low natural abundance will give improved discrimination against false alarms.

When the marker comprises a resonant material attached to or adjacent to a permanent or semi-permanent magnet, the magnetic material is advantageously a crystalline metal, an amorphous metal, or a crystalline or powdered ferrite-type material such as that used in magnetic recording media. The magnet may be a permanent magnet—i.e. have very high coercitivity; or a semi-permanent, switchable magnet—preferably one with coercitivity between 100 $Am^{-1}$ and 50,000 $Am^{-1}$. The magnetic material may also be a composite of materials of differing properties designed to produce a high intensity, uniform field.

The marker may comprise a magnet in the form of a sheet of material placed over or underneath the resonant material or, preferably, the resonant material and the magnet may be substantially co-planar. In one preferred embodiment, the resonant material is adjacent to the tips or edges of a strip or sheet of the magnetic material, or placed in a small gap in an annulus or toroid of the magnetic material.

In further embodiments of the marker, a magnetic material is intimately mixed with the resonant material to form a magnetic matrix around it, or the magnetic material is used to encapsulate the resonant material.

In one embodiment of marker, there is a plurality of magnetically active regions arranged physically so as to generate a unique magnetic resonant signal when the marker is interrogated with a predetermined magnetic field.

In certain embodiments it is advantageous to assemble the marker in such a way that the magnetic field from the magnetic material is of high amplitude and very uniform across the sample of the resonant material. This keeps the resonant signal sharp—i.e. narrow and of maximum amplitude. Further embodiments with this advantageous property will be obvious to those skilled in the design of magnetic systems.

The resonant frequency shown by the resonant material depends, amongst other parameters, on the strength of the magnetic field in which it is placed. If a magnetic field of non-uniform spatial distribution is applied to the material, then different regions of the material will have different resonant frequencies. In another embodiment of this invention this spread of frequencies is used to compensate for any manufacturing variations in the marker of this invention, or in a detection system for identifying such a marker; the same effect can also compensate for any unknown or unpredictable external magnetic field (for example the Earth's field) which might affect the magnetic field which is deliberately applied by the detection system to generate a specific resonance in the marker.

In such instances of resonance where the orientations of the magnetic field with respect to the microwave radiation or the interrogation apparatus is critical to the amplitude of the resonance, the magnetic element in the marker or the detection system may be arranged to generate a diverging magnetic field in order to increase the number of different orientations at which magnetic field lines intersect the marker.

In one embodiment of the second aspect of this invention as defined above, the marker carrying a plurality of magnetically active regions (which may, for example, comprise soft magnetic regions, semi-hard magnetic regions and hard magnetic regions as well as the magnetically resonant material) is used in conjunction with a suitable detection system, whereby the magnetic field generated within the marker by the field applied by the detection system is inhomogeneous and has a specific and characteristic form. This result may be achieved by using, in the marker, portions of resonant material positioned so that when subjected to the applied field of the detection system, they are located at points or regions having a different field gradient. The same result may also be achieved with a marker including several small ferromagnetic elements between a major magnetically active region (e.g. a strip of a magnetically soft material) and the resonant material. The result in such cases is that the range and frequencies of the resonant responses from the marker can be used as information representing a code which is a further distinguishing feature of the identity of the resonant element or of the article or body carrying the marker. This allows markers of this invention to be used for article coding. In one embodiment this coding may be altered by positioning samples of the resonant material at various distances from a magnetic element or plurality of elements of fixed magnetisation. If a plurality of resonant elements is used to generate a plurality of distinguishable resonances, then various combinations of position and hence of resonances will represent different identifier codes.

In another embodiment the positions of the resonant elements are fixed, but they are placed close to a plurality of magnetically switchable semi-permament magnetic elements so that the magnetic environment of the resonant elements can be altered in a non-contact fashion by changes in an external, applied magnetic field. With a variety of magnetic elements of different coercive fields, the identifier codes may be altered by this method in a controlled manner.

Magnetic resonant materials can also exhibit echo phenomena such as spin echoes or ferromagnetic echoes under certain conditions. One class of these echo phenomema rely on non-linear coupling mechanisms between energy storage modes in the materials, and the amplitude of the echo is sensitive to a number of parameters such as strain in the material, the shape of the sample, the homogeneity of the magnetic field in the sample, and the time delay for excitation of the echo. According to a further aspect of this invention, these materials can be used as parametric amplifiers dependent on any of these properties, and this characteristic can be used in security or identification systems. The echo is manifested as a microwave echo emitted by the sample in response to a microwave pulse or train of pulses incident on the material, usually following a specific time after the final incident pulse. In one embodiment, the spin echo relies upon magnetoelastic (or magnetostrictive) coupling of energy to mechanical vibrations of the detectable marker, and the spin-echo delay time can be made to depend upon the dimensions of the marker.

As a further example, the echo delay time may depend upon the shape of a sample or crystal of the material, with a randomly-shaped crystal showing a number of echo delays or echo resonances with a variety of amplitudes. These can be used to distinguish an individual crystal of the material. It is a characteristic of one class of spin echo that the echo is enhanced by irregular shape of the crystal and by an inhomogenous magnetic field. This type of echo is particularly suited to implementation in manufactured detectable markers, where inhomogeneity and irregularity are likely to occur.

If the crystal is produced in a way which is difficult to reproduce, then a unique identifier code can be generated. This can be used to identify an individual person or article which carries the crystal in a security system. An example of the production of a crystal of unique shape is to shatter a very small crystal, and then use individual random shards. The shards can be interrogated remotely by microwaves, and very small volumes can be detected under resonant echo excitation.

In another embodiment, the spin echoes are excited by two shorter burst of electromagnetic energy at the resonant frequency separated by a time $t_i$. A third, echo response results at the same time interval $t_i$ after the second burst as a result of the evolution of the magnetisation resulting from constructive interference of precessing magnetic spins induced by the two interrogation pulses in the spin system. The time $t_i$ is carefully chosen with reference to the spin relaxation times of the magnetically resonant moiety in order to maximise the amplitude of the echo which indicates the presence of the marker material. In order to generate a strong echo signal it is advantageous if the excitation pulse duration $t_p$ is short compared to one cycle time $t_r$ of the resonant frequency, and furthermore if both $t_p$ and $t_i$ are much shorter than the spin relaxation or decay times for the aligned spin system. Maximal spin echo amplitude is observed if $t_p/t_r$ is approximately $\frac{1}{3}$.

The echo delay time may be several microseconds, with the shape and amplitude of the echo as a function of time dependent on the input signal shape. Both of these characteristics may be used as identifiers of the presence of the spin-echo material. Phenomena which can be used for this application include ferromagnetic echoes, ferrimagnetic echoes, spin-wave echoes and antiferromagnetic echoes. The materials which exhibit these phenomena may be crystalline, amorphous, multiphase or composite manufactured materials. Particular examples of materials which show these echo phenomena are yttrium iron garnet and yttrium aluminium garnet.

The extreme sharpness of the resonance exhibited by certain substances exhibiting magnetic resonances can be exploited to advantage in two embodiments of the invention. The narrow resonance indicates a low damping or loss in the oscillating spin systems, which may also be expressed as a high oscillatory quality factor, or Q-factor. This in turn may be viewed as a high effective gain, leading to an anomalously high absorbtion of energy from the interrogating electromagnetic field at or near to resonance. This sharp resonant absorbtion is highly characteristic of the marker material. In one embodiment of the invention, this absorption, from a continuously applied interrogating field, is detected to indicate the presence of the marker.

The high Q-factor is also manifested as a prolonged emission of electromagnetic energy from the marker at a characteristic frequency (the resonant frequency) or frequencies after the interrogating electromagnetic field has been switched off. According to another preferred embodiment, the interrogation field is pulsed on for short periods of time and then switched off. The characteristic emission from the marker continues after the excitation has been stopped, and is detected a few microseconds or even milliseconds later. Particular uniqueness associated with the marker can also be derived from measuring the phase of this emission and/or the specific way in which the amplitude and phase evolves in time. This latter embodiment is particularly useful where the dynamic range in the detection system limits the ability to detect small amounts of absorbtion from a continuously applied interrogation field. It will be clear to those skilled in the art that the spin echo phenomena described above can be exploited in accordance with this invention by the use of interrogation fields which are pulsed in an appropriate manner, and where detection is carried out some time after the interrogation pulses. Methods for implementing these embodiments, such as detection of a phase shift during absorbtion, use of bridged detectors, and pulsing techniques, are well know in the art, and will not be described in detail.

It is usually of advantage in theft-prevention systems and other systems in accordance with this invention to be able to leave the detectable marker on the protected object or person when it is legitimately purchased or otherwise legitimately moved through the detection zone. Because of this it is desirable to have a means for deactivating or disarming the detectable marker.

According to a fifth aspect of this invention, there is provided a marker comprising a substrate including or supporting a magnetically resonant material, wherein the marker further comprises deactivating means whereby the resonant properties of the marker can be altered in a predetermined manner. The means for deactivating the resonant material may be a deactivation zone provided on or in the marker itself; or it may be an element which responds directly or indirectly to an externally applied force so as to alter the chemical, crystallographic, or physical nature of the detectable marker. In one embodiment the resonance frequency is altered by inducing a chemical or crystallographic change in the resonant material. These changes alter the local atomic environments of the magnetic dipoles and hence their effective magnetic moments. The change is resonance frequency leads either to the marker not being detected in the expected bandwidth of the detection system, or to the altered frequency being recognized as characteristic of disarmed markers. Chemical or physical changes can also be used in a similar fashion to lower the quality factor of the resonant species, i.e. to destroy the resonance, sufficiently for the marker to be no longer detectable, and hence to deactivate it. Suitable techniques to induce these changes are heating by an electromagnetic or particle beam, or by friction, cooling, release of a reactive chemical agent onto the resonant material, dissolving in a solvent, or physically breaking up the material.

In another embodiment, the deactivation is carried out by changes to the magnetic field of the magnetic element. This is achieved by a degaussing magnetic field, by heating or mechanical working or a combination of the two, by physically breaking up the configuration of the magnetic material, or by changing the direction or amplitude of the magnetisation in the magnetic element of in the region of the resonant material by applying an external field to the element or to secondary elements close to the main element. Even small changes in the magnetic field at the resonant material will lead to detectable changes in the resonant frequency, and hence to an indication of deactivation.

The selection of appropriate marker materials and of suitable deactivation regimes for the selected material will be made so as to be congruent with the intended application. Thus for antipilferage tags intended for use in retail establishments, a thermal or magnetic deactivation system will generally be used in preference to one requiring the use of reactive chemicals.

For a better understanding of the present invention, preferred embodiments will now be described by way of example, with reference to the accompanying drawings in which.

Figure 1A:
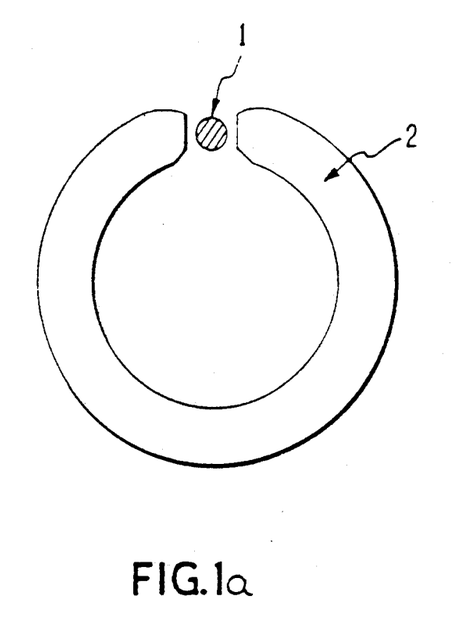
FIGS. 1a, 1b, and 2 show examples of configurations of a detectable marker.
Figure 1B:
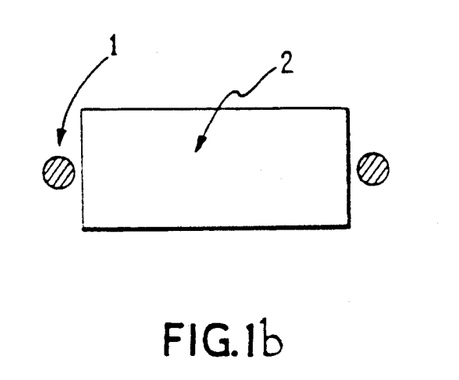

Referring first to FIGS. 1a and 1b, a resonant material 1 and a magnetising material 2 are substantially planar. The detectable marker may have a variety of configurations. In FIG. 1a, material 1 is contained in the gap in an annulus of material 2, the magnetic material preferentially being magnetised circumferentially to generate a high magnetic field across the gap. In FIG. 1b, small samples of the resonant material 1 are placed at the tips of a sheet or strip of the magnetic material 2, which is preferentially magnetised longitudinally to produce a high magnetic field across the resonant material. It will be clear that these configurations may equally well be implemented as substantially 3-dimensional structures—i.e. as toroids or rods or blocks. However, laminar structures are preferred since they are more easily incorporated into inobtrusive markers.

Figure 2:
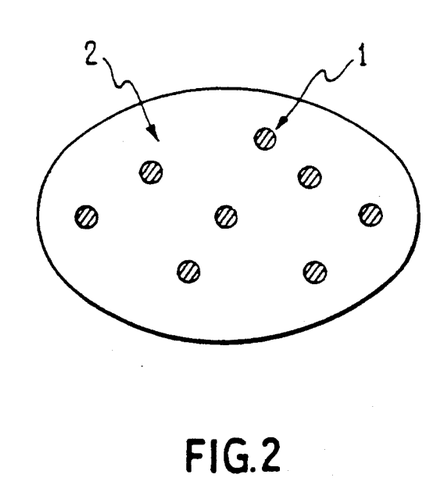

Referring to FIG. 2, the resonant material 1 is incorporated, mixed, or encapsulated with the magnetic material 2 in order to improve the magnetic field coupling to material 1. In this and in other embodiments it is advantageous to use circular, spherical, elliptical, or generally ellipsoidal shaped samples of the resonant material in order to improve the uniformity of the magnetic field across the sample.

Figure 3:
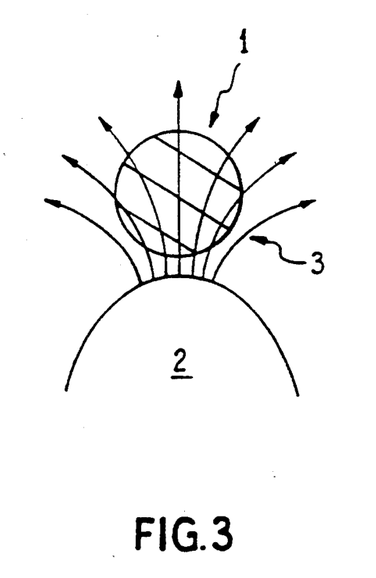
FIG. 3 shows a schematic diagram illustrating the configuration of magnetic field lines in one embodiment of detectable marker.

Referring next to FIG. 3, the magnetic field 3 generated by the magnetic material 2 is shown schematically to be diverging over the region of the resonant material 1. This may be exploited in the manner described hereinbefore to give a variety of resonant conditions within a single sample of material 1, both as regards orientation of the magnetic moments with respect to the detection apparatus, and as regards the exact value of the resonant frequency.

Figure 4A:
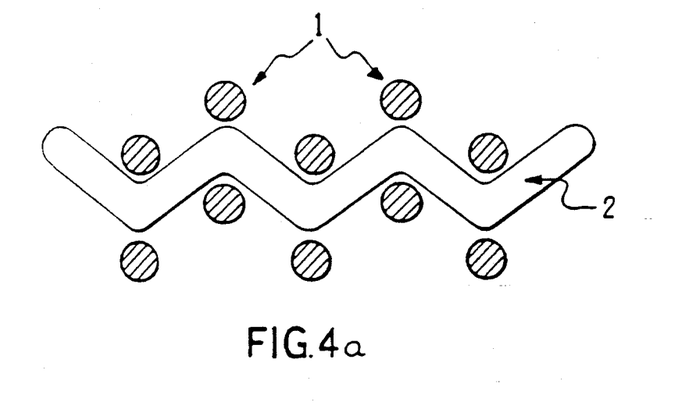
FIGS. 4a and 4b show further examples of detectable marker configuration.
Figure 4B:
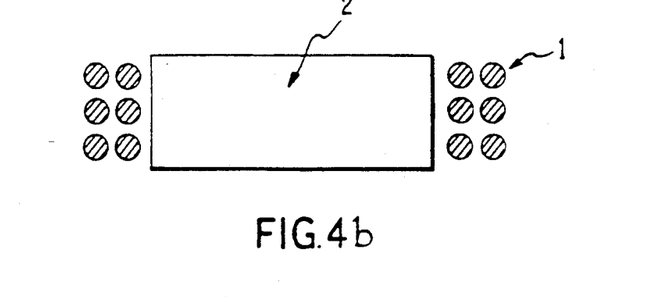

FIGS. 4a and 4b show how diverging fields of the type shown in FIG. 3 may be further exploited by placing a plurality of elements 1 of resonant material in positions which are either magnetically equivalent or magnetically different around the magnetising material 2. It will be clear that the plurality of elements 1 may also be implemented as a single extended element. With careful positioning of a plurality of elements, a number of relatively discrete resonance conditions may be established. This multiplicity of different resonances may be used as described hereinbefore to generate a unique identifier code attributable to a single article, person, or group of articles or people.

Figure 5:
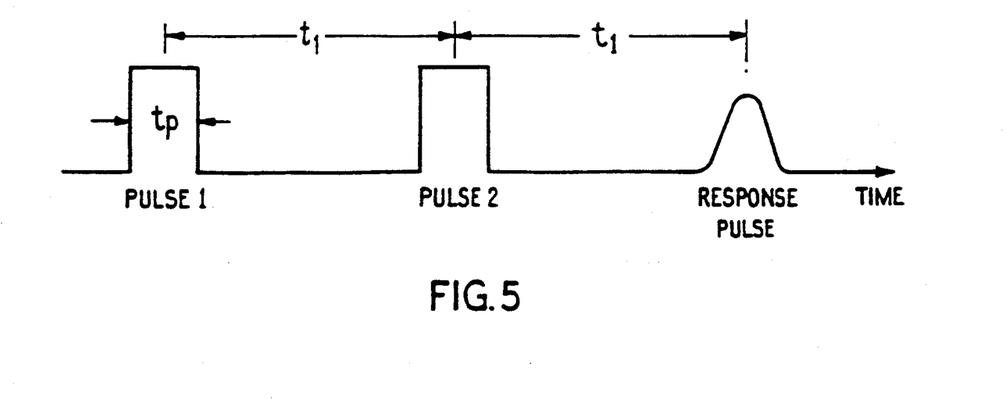
FIG. 5 shows a schematic diagram of the generation of a spin-echo pulse of electromagnetic radiation.

FIG. 5 shows the time evolution of electromagnetic energy during generation of a spin-echo pulse. The height of the pulses represents the amplitude of the electromagnetic field, and the horizontal axis shows time. Pulse 1 and pulse 2, each of width $t_p$, are applied by the pulsed external radiofrequency or microwave source at a time interval $t_1$. The resonant material produces a discrete response pulse at a time $t_1$ after the second pulse, and this response pulse is detected to indicate the presence of the detectable marker.

Figure 6:
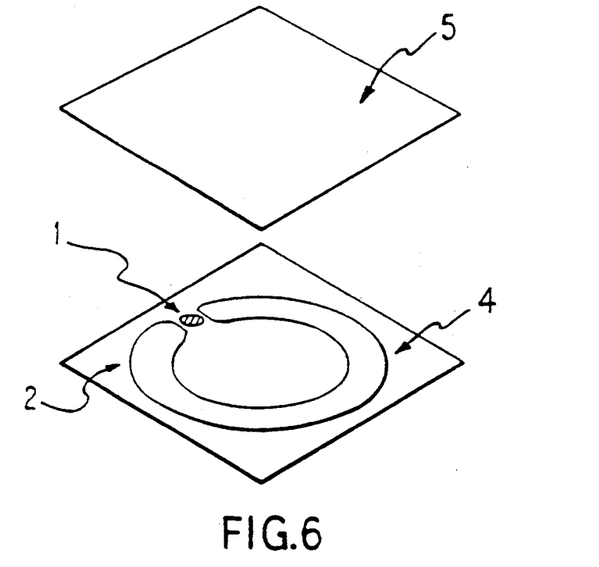
FIG. 6 shows an exploded view of a detectable marker incorporated into an antipilferage tag.

FIG. 6 shows how a detectable marker of the type shown in FIG. 1 may be incorporated into an antipilferage tag or an identifying marker. The components 1 and 2 comprising the marker are placed onto a substrate 4, or manufactured by direct deposition on the substrate. The substrate 4 may be a sheet of paper or polymer or other flexible material, or a non-flexible sheet or block of supporting material. The underside of the substrate may be covered in a layer of glue or other fixing agent or mechanism to secure it to the object to be marked or protected. In addition, to conceal the purpose of the marker, a face covering or face paper 5 may be laminated to the marker.

Figure 7:
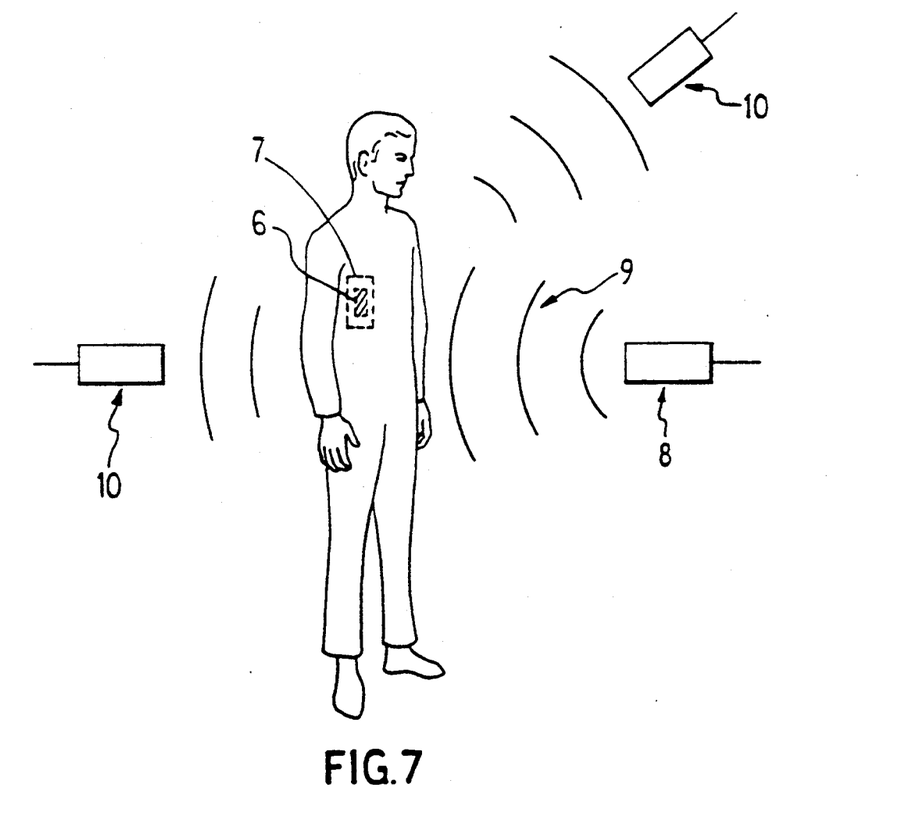
FIG. 7 shows schematically a system for detecting a concealed detectable marker.

FIG. 7 shows a schematic of the identification or detection of the passage of a concealed marker 6 which is attached to some protected article 7. A microwave or radiofrequency source emits electromagnetic radiation 9. The absorption of energy due to the presence of the marker or the re-emission of energy by the marker is detected by one or more microwave or radiofrequency receivers 10.

Figure 8:
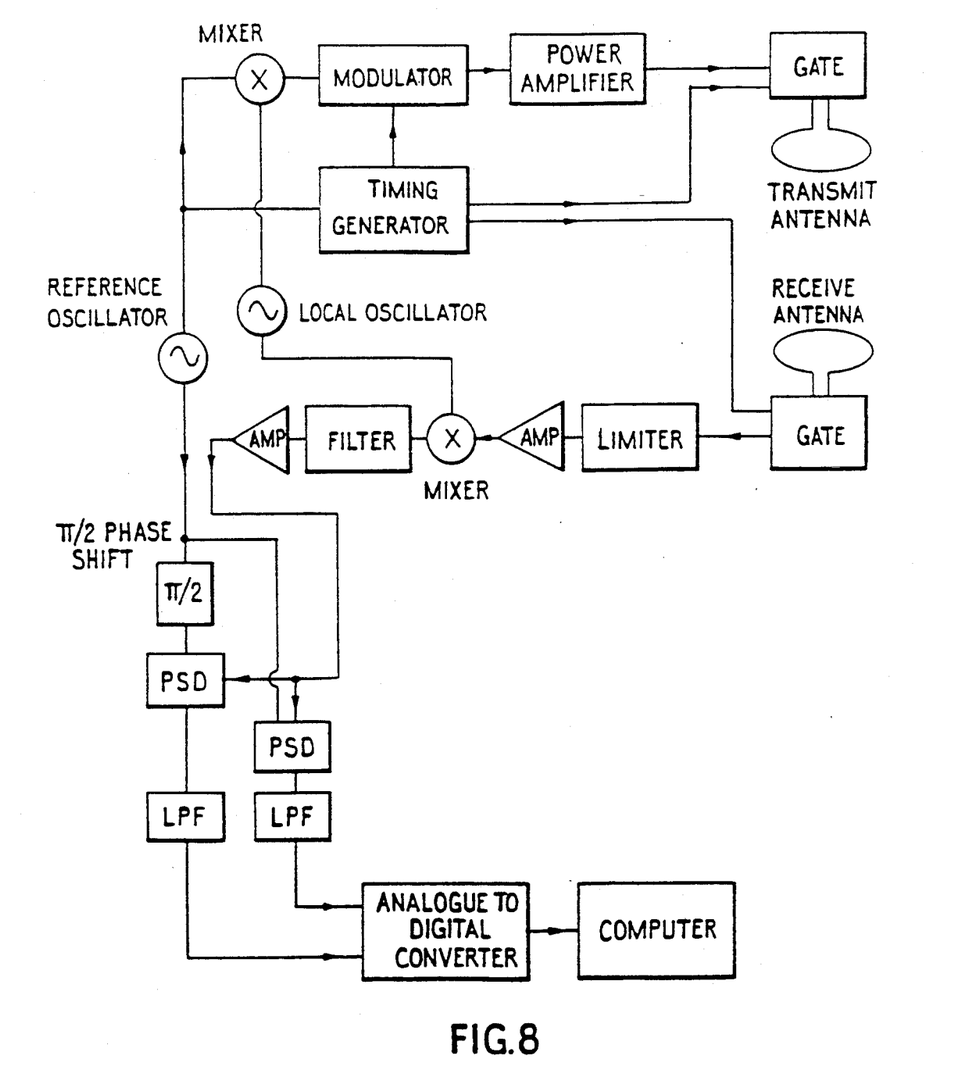
FIG. 8 shows a schematic representation of a radio-frequency or microwave system suitable for generation and detection of characteristic "identity" signals emanating from a detectable marker of this invention.

Referring to FIG. 8, LPF represents a low-pass filter, PSD represents a phase sensitive detector, and 'Amp' represents signal amplifier. The gates are electronic switches to rapidly switch the transmission or reception on or off, to enable the system to work in a pulsed mode. The switch timing is controlled by the timing generator, and may be implemented either by PIN diodes or by a combination of circulators and PIN switches to give extremely fast switching times (less than 0.2 ns).

In the receive circuit, the limiter is necessary to protect the first amplifier (preferably a low noise amplifier) from residual leakage of transmit signal through the receiver gate in its off condition.

The combination of two phase sensitive detectors in quadrature allows full measurement of the phase of the signal. The phase and amplitude characteristics of the signal are analysed by the computer or processing unit to assess if a marker is present.

For continuous, rather than pulsed, operation, the electronic gates in the circuit are not necessary. In this case the local oscillator may be swept frequency oscillator, producing an interrogation frequency which sweeps across the expected range of the marker resonance frequency.

The invention will be illustrated further in non-limiting fashion by the following Examples.

EXAMPLE 1

This Example describes the construction of an antipilferage marker comprising a magnetic material and a resonant material, assembled onto a substrate. The magnetic material is a semi-permanent magnet made from Vacozet, a proprietary material produced by Vacuumschmeltze of West Germany. This material has a high remanent magentization and is manufactured with a variety of coercive fields. In the chosen embodiment, material with a coercive field of 3,000 Am$^{-1}$ was used, although this choice is not critical—a coercive force of over 10,000 Am$^{-1}$ can be used. Alternatively, other magnetic materials such as nickel or magnetic stainless steels may be used in this embodiment as the magnetic element. An annulus of thickness 40 microns, diameter 10 mm, and track width 3 mm is punched from a sheet of the material and stuck to a substrate of paper coated with a pressure-sensitive glue. Approximately 1 mg of a powder in the form of an impermeable resin containing small crystals of diphenyl picryl hydrazyl of diameter approximately 100 microns is then placed centrally in the gap in the magnetic annulus, and the marker is then covered with a protective layer of paper. The composite is then cut to a square label of dimensions 12 mm $\times$ 12 mm. The resonant material experiences a magnetic field of approximately 30 mT, and has an electron spin resonant frequency of approximately 1 GHz with a resonance half width less than 1 MHz, indicating a decay time after excitation of more than 1 microsecond. The magnetic material in this Example was chosen so that a degaussing field of maximum amplitude of the order of 10,000 A/m could be used to deactivate the marker (by altering the resonant properties of the resonant material).

EXAMPLE 2

This Example is similar to Example 1 in that the magnetizing element is constructed in the same manner. However, the resonant material in this Example consists of small spheres, 100 microns in diameter, of yttrium iron garnet. In this case the material shows a ferromagnetic resonance at 1 GHz with a quality factor of approximately 5,000 giving a decay time, again, of more than 1 microsecond.

EXAMPLE 3

In this Example, the resonant material is the same as in Example 1 or Example 2, but the magnetic material is replaced by a permanent magnetic material. Alcomax is a suitable proprietary material, as is Ferroba, a barium ferrite. These materials are deposited in the form of a powder slurry mixed with a thermosetting resin, and printed in a layer approximately 100 microns thick. The material is magnetized by placing it close to a permanent magnet or by a pulsed current in a coil adjacent to or threading the annulus. Finally the slurry is set by gentle heating of the glue, to fix the direction of magnetization.

I claim:

1. A detectable marker which comprises a substrate which supports a resonant material for generating an identifiable signal from magnetic resonance when simultaneously subjected to a magnetic field and electromagnetic radiation.

2. A detectable marker which comprises a substrate including a material for generating a magnetic field, and a resonant material for generating an identifiable signal from magnetic resonance.

3. A marker as claimed in claim 1, wherein said magnetic resonance is electron spin resonance (ESR).

4. A marker as claimed in claim 1, wherein said magnetic resonance is nuclear magnetic resonance (NMR).

5. A marker as claimed in claim 3, wherein the resonant material is a salt including a paramagnetic ion.

6. A marker as claimed in claim 5, wherein said paramagnetic ion is $Cu^{2+}$, $Mn^{2+}$, $Fe^{3+}$, $Gd^{3+}$, $Cr^{3+}$, $Tb^{3+}$, $Er^{3+}$.

7. A marker as claimed in claim 5, wherein said paramagnetic ion is diluted in a diamagnetic medium.

8. A marker as claimed in claim 7, wherein said diamagnetic medium is magnesium oxide.

9. A marker as claimed in claim 3, wherein the resonant material is an organic molecule.

10. A marker as claimed in claim 3, wherein the resonant material is a crystalline solid containing ionic impurities.

11. A marker as claimed in claim 9, wherein said resonant material is naphthalene, a nitroxide, diphenyl picryl hydrazyl, or triphenyl methyl.

12. A marker as claimed in claim 1, wherein said magnetic resonance is ferromagnetic resonance.

13. A marker as claimed in claim 1, wherein said magnetic resonance is spin-echoes.

14. A marker as claimed in claim 1, wherein said magnetic resonance is spin-wave resonance.

15. A marker as claimed in claim 1, wherein the marker is fabricated as a laminar item.

16. A marker as claimed in claim 1, wherein said substrate includes a permanent magnetic material in addition to said magnetically resonant material.

17. A marker as claimed in claim 16, wherein the marker includes a semi-permanent magnet with a coercivity in the range 100 A/m to 50,000 A/m.

18. A marker as claimed in claim 16, wherein the resonant material is located adjacent to the magnetic material.

19. A marker as claimed in claim 16, wherein the resonant material is located in a gap in an annulus of magnetic material.

20. A marker as claimed in claim 16, wherein the resonant material is located within the magnetic material.

21. A marker as claimed in claim 16, wherein the magnetic material is arranged on the substrate relative to the resonant material such as to provide a substantially uniform magnetic field throughout the resonant material.

22. A marker as claimed in claim 21, wherein the resonant material has a rounded shape.

23. A marker as claimed in claim 16, wherein the magnetic material is arranged on the substrate relative to the resonant material such as to provide a substantially divergent magnetic field across the resonant material.

24. A marker as claimed in claim 2, wherein the resonant material is divided into a plurality of parts which are arranged physically with respect to said magnetic field generating material so as to generate a unique magnetic resonant signal when the marker is interrogated with a predetermined magnetic field.

25. A marker as claimed in claim 13, wherein the resonant material is arranged on the substrate so as to undergo magnetostrictive coupling with mechanical vibrations of the marker.

26. A marker as claimed in claim 25, wherein the resonant material is a crystal of irregular shape.

27. A detection system for use with a marker as defined in claim 1, which system comprises a gate which, in use, will be located at a point of sale location or between a point of sale location and an exit from the premises containing said point of sale location, which gate comprises means for emitting radiation in the microwave waveband; and means for detecting radiation emitted by the tag or marker in response to a magnetic field in conjunction with said microwave radiation.

28. A detection system as claimed in claim 27, wherein said means for emitting microwave radiation is arranged to emit pulses of radiation.

29. A detection system as claimed in claim 28, which further includes means for detecting the waveform of radiation emitted by the marker in response to microwave radiation.

30. A detection system for use with a marker as claimed in claim 1 which system comprises a gate which comprises means for generating a magnetic field across the gate; and means for detecting the resonant response of the marker to said magnetic field.

31. A marker comprising a substrate including a magnetically resonant material, and means for deactivating the resonant properties of the resonant material in a predetermined manner.

32. A marker as claimed in claim 31, wherein the resonant properties of the resonant material are capable of deactivation by an alteration of the chemical properties of the material.

33. A marker as claimed in claim 1, wherein said magnetic resonance is ferrimagnetic resonance.

34. A marker as claimed in claim 1, wherein said magnetic resonance is antiferrimagnetic resonance.

35. A marker as claimed in claim 1, wherein said magnetic resonance is domain wall resonance.

36. A marker as claimed in claim 1, wherein said substrate includes a semi-permanent magnetic material in addition to said magnetically resonant material.

37. A marker as claimed in claim 32, wherein the resonant properties of the resonant material are capable of deactivation by an alteration of the crystallographic properties of the material.

38. A marker as claimed in claim 32, wherein the resonant properties of the resonant material are capable of deactivation by an alteration of the physical properties of the material.

* * * * *